US009922957B2

(12) United States Patent
Watanabe

(10) Patent No.: US 9,922,957 B2
(45) Date of Patent: Mar. 20, 2018

(54) SEMICONDUCTOR DEVICE AND METHOD FOR MANUFACTURING THE SAME

(71) Applicant: Toshiba Memory Corporation, Tokyo (JP)

(72) Inventor: Shinya Watanabe, Oita Oita (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/056,189

(22) Filed: Feb. 29, 2016

(65) Prior Publication Data

US 2017/0069600 A1 Mar. 9, 2017

(30) Foreign Application Priority Data

Sep. 4, 2015 (JP) .................................. 2015-174753

(51) Int. Cl.
*H01L 25/065* (2006.01)
*H01L 23/528* (2006.01)
(Continued)

(52) U.S. Cl.
CPC .... *H01L 25/0657* (2013.01); *H01L 21/76898* (2013.01); *H01L 23/481* (2013.01); *H01L 23/528* (2013.01); *H01L 24/05* (2013.01); *H01L 24/11* (2013.01); *H01L 24/16* (2013.01); *H01L 24/81* (2013.01); *H01L 25/50* (2013.01); *H01L 2224/05084* (2013.01); *H01L 2224/05144* (2013.01); *H01L 2224/05147* (2013.01); *H01L 2224/05155* (2013.01); *H01L 2224/05166* (2013.01); *H01L 2224/13022* (2013.01);
(Continued)

(58) Field of Classification Search
CPC . H01L 23/481; H01L 23/5389; H01L 23/528; H01L 24/05–24/09; H01L 25/043; H01L 25/0657; H01L 25/074; H01L 25/0652; H01L 25/071; H01L 25/0756; H01L 27/3209
See application file for complete search history.

(56) References Cited

U.S. PATENT DOCUMENTS

2009/0129037 A1* 5/2009 Yoshino ............... H01L 23/5389
361/761
2011/0254165 A1 10/2011 Muranaka
(Continued)

FOREIGN PATENT DOCUMENTS

JP 2003078108 A 3/2003
JP 2003234432 A 8/2003
JP 2011-228419 A 11/2011

OTHER PUBLICATIONS

TW Office Action dated Oct. 12, 2016 for Application No. 105103350.

*Primary Examiner* — Cuong Q Nguyen
(74) *Attorney, Agent, or Firm* — Patterson & Sheridan, LLP

(57) ABSTRACT

A semiconductor device includes a substrate, a first electrode located on an upper surface of the substrate, and a second electrode located on a lower surface of the substrate and electrically connected to the first electrode. The semiconductor device further includes a first resist layer located on the upper surface of the substrate so as to surround the first electrode and spaced from the first electrode, and a second resist layer located on the lower surface of the substrate.

12 Claims, 14 Drawing Sheets

(51) Int. Cl.
*H01L 23/48* (2006.01)
*H01L 23/00* (2006.01)
*H01L 21/768* (2006.01)
*H01L 25/00* (2006.01)

(52) U.S. Cl.
CPC ............... *H01L 2224/13025* (2013.01); *H01L 2224/13084* (2013.01); *H01L 2224/13111* (2013.01); *H01L 2224/13147* (2013.01); *H01L 2224/13155* (2013.01); *H01L 2224/13166* (2013.01); *H01L 2224/16112* (2013.01); *H01L 2224/16146* (2013.01); *H01L 2225/06513* (2013.01); *H01L 2225/06544* (2013.01); *H01L 2924/0132* (2013.01); *H01L 2924/05042* (2013.01); *H01L 2924/05442* (2013.01); *H01L 2924/10253* (2013.01); *H01L 2924/20752* (2013.01)

(56) References Cited

U.S. PATENT DOCUMENTS

| | | | |
|---|---|---|---|
| 2012/0049354 A1* | 3/2012 | Sawayama | H01L 23/3135 257/737 |
| 2012/0276733 A1 | 11/2012 | Saeki et al. | |
| 2013/0264720 A1* | 10/2013 | Chun | H01L 23/481 257/774 |
| 2015/0194404 A1* | 7/2015 | Liang | H01L 23/481 257/737 |

\* cited by examiner

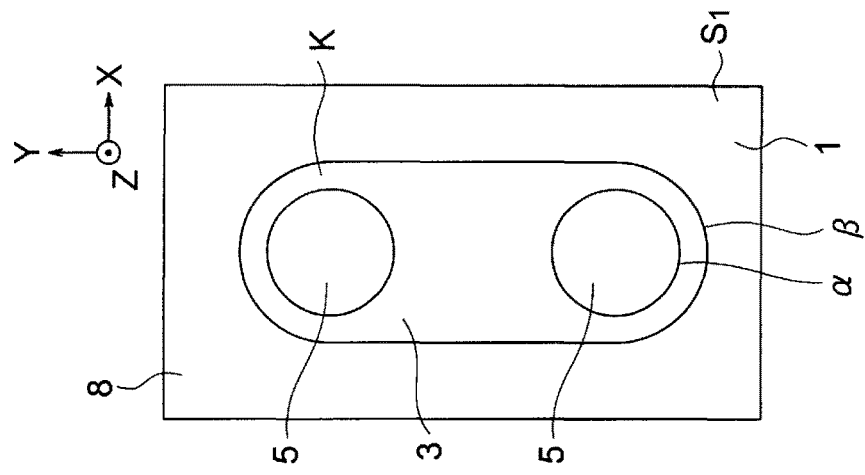
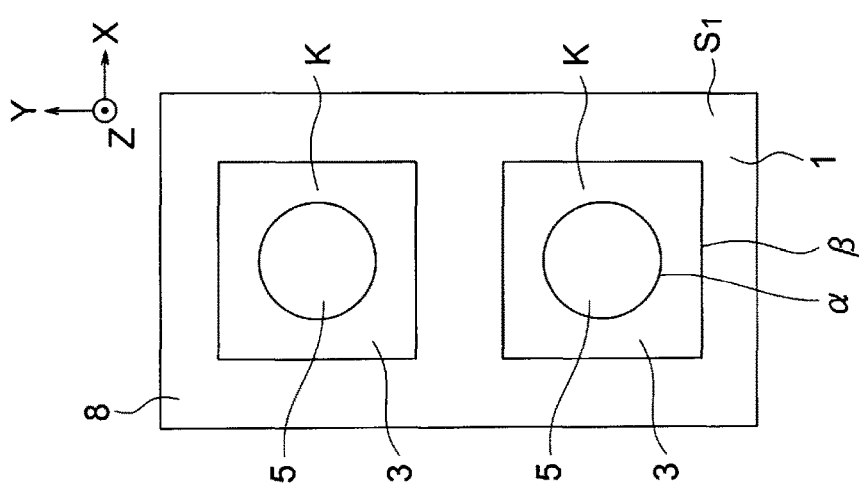
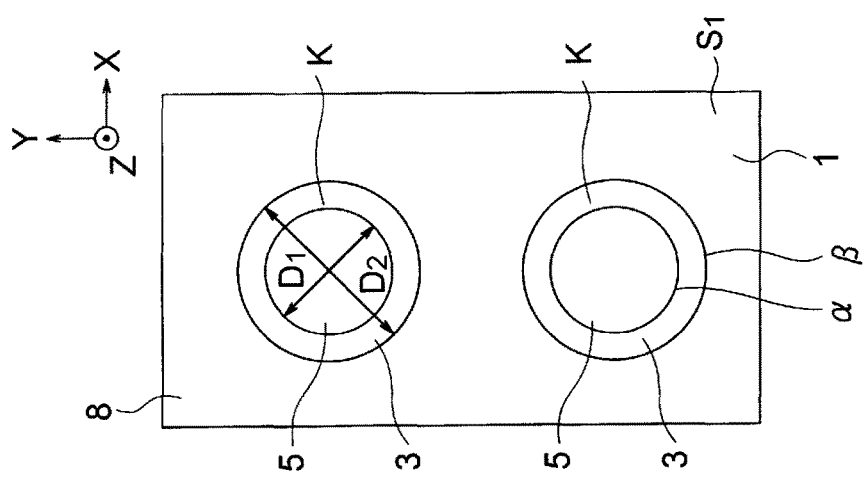

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-174753, filed Sep. 4, 2015; the entire contents of which are incorporated herein by reference.

FIELD

Embodiments described herein relate generally to a semiconductor device and a method for manufacturing the same.

BACKGROUND

A semiconductor chip sometimes includes a through electrode called a through silicon via (TSV) electrode. The TSV electrode includes a front surface electrode formed on a front surface of the substrate and a back surface electrode formed on aback surface of the substrate. On the front surface of the substrate, a transistor and multilayer wires are formed. The front surface electrode is formed on the front surface of the substrate and is connected to the multilayer wires, and the back surface electrode is formed on the back surface of the substrate and extends inwardly of the substrate to reach the multilayer wires.

When the semiconductor chips provided with the TSV electrode are electrically connected to each other, one of the chips is stacked on the other chip and the back surface electrode of the one chip is joined to the front surface electrode of the other chip. However, in this case, the distance between these chips cannot be sufficiently reduced.

DESCRIPTION OF THE DRAWINGS

FIGS. 6A to 6C are enlarged partial plan views depicting the structure of the front surface side of the semiconductor device according to the first embodiment.

DETAILED DESCRIPTION

Embodiments provide a semiconductor device and manufacturing method that can reduce the distance between semiconductor chips when the semiconductor chips are stacked.

In general, according to one embodiment, a semiconductor device includes a substrate, a first electrode located at an upper surface of the substrate, and a second electrode located at a lower surface of the substrate and electrically connected to the first electrode. The semiconductor device further includes a first resist layer located at the upper surface of the substrate so as to surround the first electrode and spaced from the first electrode, and a second resist layer located at the lower surface of the substrate.

Hereinafter, an embodiment will be described with reference to the drawings.

First Embodiment

Figure 1:
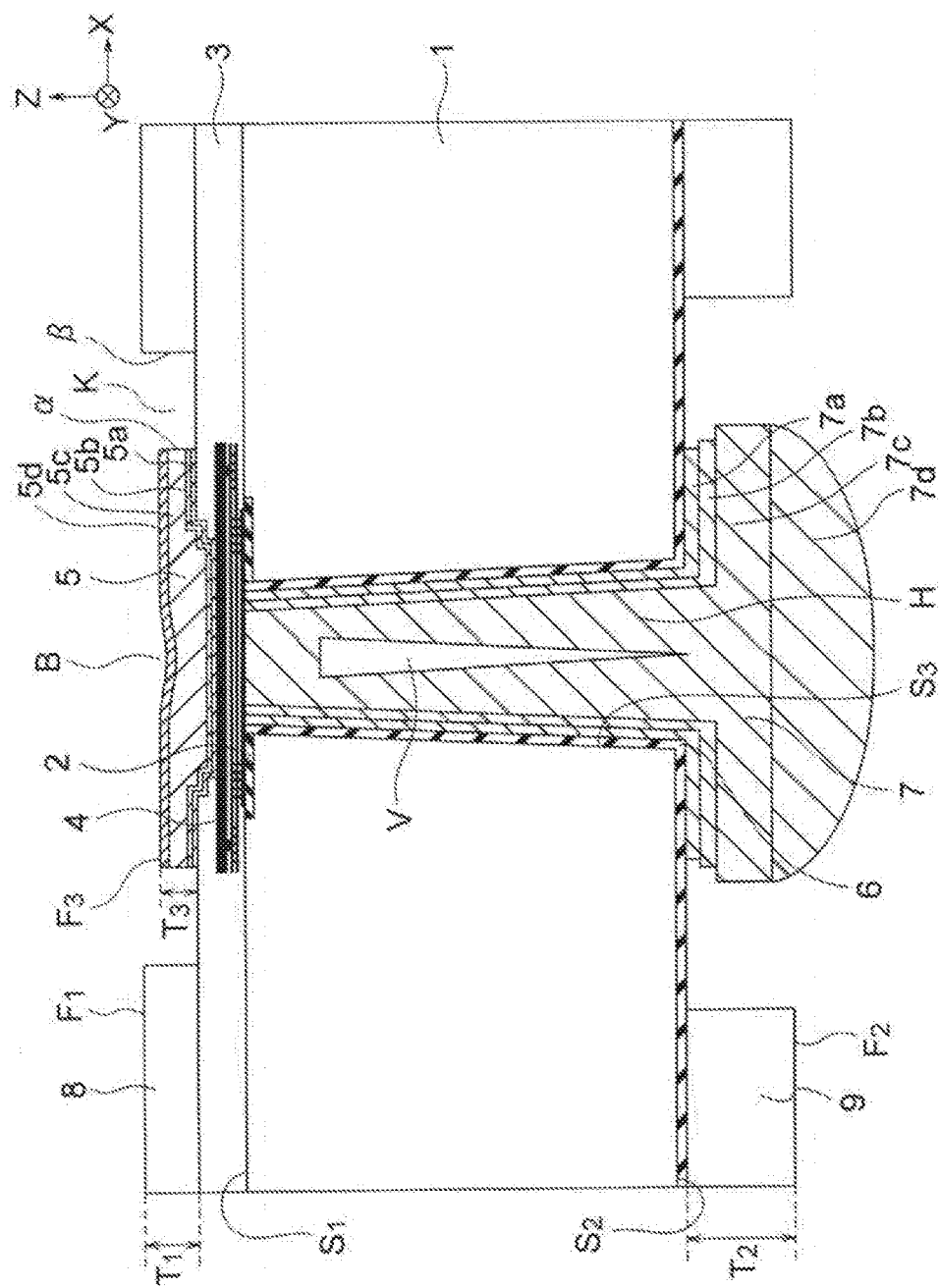
FIG. 1 is a sectional view depicting the structure of a semiconductor device according to a first embodiment.

FIG. 1 is a sectional view depicting the structure of a semiconductor device according to a first embodiment. FIG. 1 depicts a cross section of one semiconductor chip.

The semiconductor device of FIG. 1 includes a substrate 1, a first insulating film 2, an interlayer dielectric 3, a wiring portion 4, a front surface electrode (a front surface bump) 5, a second insulating film 6, a back surface electrode (a back surface bump) 7, a front surface resist layer 8, and a back surface resist layer 9. The front surface electrode 5 and the back surface electrode 7 are examples of first and second electrodes. The front surface resist layer 8 and the back surface resist layer 9 are examples of first and second resist layers.

An example of the substrate 1 is a semiconductor substrate such as a silicon substrate. The character $S_1$ denotes the front surface (an upper surface) of the substrate 1. The character $S_2$ denotes the back surface (a lower surface) of the substrate 1. The character $S_3$ denotes the side surface of a through hole H provided between the front surface $S_1$ and the back surface $S_2$ of the substrate 1. FIG. 1 depicts an X direction and a Y direction which are parallel to the front surface $S_1$ and the back surface $S_2$ of the substrate 1 and are perpendicular to each other and a Z direction perpendicular to the front surface $S_1$ and the back surface $S_2$ of the substrate 1. In this disclosure, a +Z direction indicates an upward direction and a −Z direction indicates a downward direction. The −Z direction in this embodiment may coincide with the direction of gravitational force or may not coincide with the direction of gravitational force. The thickness of the substrate 1 is 33 μm, for example.

The first insulating film 2 is formed on the front surface $S_1$ of the substrate 1. The first insulating film 2 is formed so as to surround the through hole H. Examples of the first insulating film 2 are a silicon dioxide film and a silicon nitride film.

The interlayer dielectric 3 is formed on the front surface $S_1$ of the substrate 1 with the first insulating film 2 therebetween. Examples of the interlayer dielectric 3 are a silicon dioxide film and a silicon nitride film.

The wiring portion 4 includes multilayer wires and plugs connecting these wires. The wiring portion 4 is formed on the front surface $S_1$ side of the substrate 1 on the first insulating film 2 and is covered with the interlayer dielectric 3. Examples of the wiring portion 4 include various metallic layers.

The front surface electrode 5 is formed on the front surface $S_1$ side of the substrate 1. The front surface electrode 5 is formed on the wiring portion 4 and over the interlayer dielectric 3 and is electrically connected to the wiring portion 4. The character $F_3$ denotes the upper surface of the front surface electrode 5. The upper surface $F_3$ of the front surface electrode 5 has a depression B formed during formation of the front surface electrode 5. The character $T_3$ denotes the thickness of the front surface electrode 5 on the upper surface of the interlayer dielectric 3. The thickness $T_3$ is 3 μm, for example. The character α denotes the outer perimeter of the front surface electrode 5.

The front surface electrode 5 includes a first electrode layer 5a, a second electrode layer 5b, a third electrode layer 5c, and a fourth electrode layer 5d in order. An example of the first electrode layer 5a is a titanium (Ti) layer. An example of the second electrode layer 5b is a copper (Cu) layer. An example of the third electrode layer 5c is a nickel (Ni) layer. An example of the fourth electrode layer 5d is a gold (Au) layer. The first and second electrode layers 5a and 5b in this embodiment function as barrier metal layers.

The second insulating film 6 is formed on the back surface $S_2$ of the substrate 1 and the side surface $S_3$ of the through hole H of the substrate 1. Examples of the second insulating film 6 are a silicon dioxide film and a silicon nitride film.

The back surface electrode 7 is formed on the back surface $S_2$ of the substrate 1. The back surface electrode 7 is formed on the back surface $S_2$ of the substrate 1 and in the through hole H of the substrate 1 with the second insulating film 6 therebetween and is electrically connected to the wiring portion 4. As a result, the front surface electrode 5 and the back surface electrode 7 are electrically connected and form a TSV electrode (a through electrode). The character V denotes a void formed during formation of the back surface electrode 7.

The back surface electrode 7 includes a first electrode layer 7a, a second electrode layer 7b, a third electrode layer 7c, and a fourth electrode layer 7d in order. An example of the first electrode layer 7a is a titanium (Ti) layer. An example of the second electrode layer 7b is a copper (Cu) layer. An example of the third electrode layer 7c is a nickel (Ni) layer. An example of the fourth electrode layer 7d is a Sn—Cu (tin-copper) alloy layer. The first and second electrode layers 7a and 7b in this embodiment function as barrier metal layers. The fourth electrode layer 7d in this embodiment is a solder layer (a plated layer) for joining the front surface electrode 5 of one chip and the back surface electrode 7 of another chip.

The front surface resist layer 8 is formed on the front surface $S_1$ of the substrate 1 so as to surround the front surface electrode 5 and is spaced from the front surface electrode 5. The front surface resist layer 8 has an inner perimeter β which surrounds the outer perimeter α of the front surface electrode 5. An example of the front surface resist layer 8 is a phenol-based resin for suppressing stacking damage to the semiconductor chip. As is the case with the front surface electrode 5, the front surface resist layer 8 is formed on the front surface $S_1$ of the substrate 1 with the interlayer dielectric 3 therebetween. A character $F_1$ denotes an upper surface of the front surface resist layer 8. A character $T_1$ denotes the thickness of the front surface resist layer 8. The thickness $T_1$ is 5 μm, for example.

In this embodiment, the thickness $T_3$ of the front surface electrode 5 is set to be smaller than the thickness $T_1$ of the front surface resist layer 8. Thus, the height of the upper surface $F_3$ of the front surface electrode 5 is lower than the height of the upper surface $F_1$ of the front surface resist layer 8.

The back surface resist layer 9 is formed on the back surface $S_2$ of the substrate 1 and is spaced from the back surface electrode 7. An example of the back surface resist layer 9 is a novolac-based resin having an adhesive function and photosensitivity. As is the case with the back surface electrode 7, the back surface resist layer 9 is formed on the back surface $S_2$ of the substrate 1 with the second insulating film 6 therebetween. The character $F_2$ denotes a lower surface of the back surface resist layer 9. The character $T_2$ denotes the thickness of the back surface resist layer 9.

In this embodiment, the front surface resist layer 8 is removed from an area near the front surface electrode 5 and the front surface resist layer 8 is thus spaced from the front surface electrode 5. The character K denotes a region from which the front surface resist layer 8 is removed. Thus, in this embodiment, the height of the upper surface $F_3$ of the front surface electrode 5 can be made lower than the height of the upper surface $F_1$ of the front surface resist layer 8. As a result, the thickness $T_2$ of the back surface resist layer 9 can also be reduced. Thus, according to this embodiment, when the semiconductor chips having the structure of FIG. 1 are stacked, the distance between the semiconductor chips can be reduced with stacking damage to the semiconductor chips being suppressed by the front surface resist layer 8.

Figure 2:
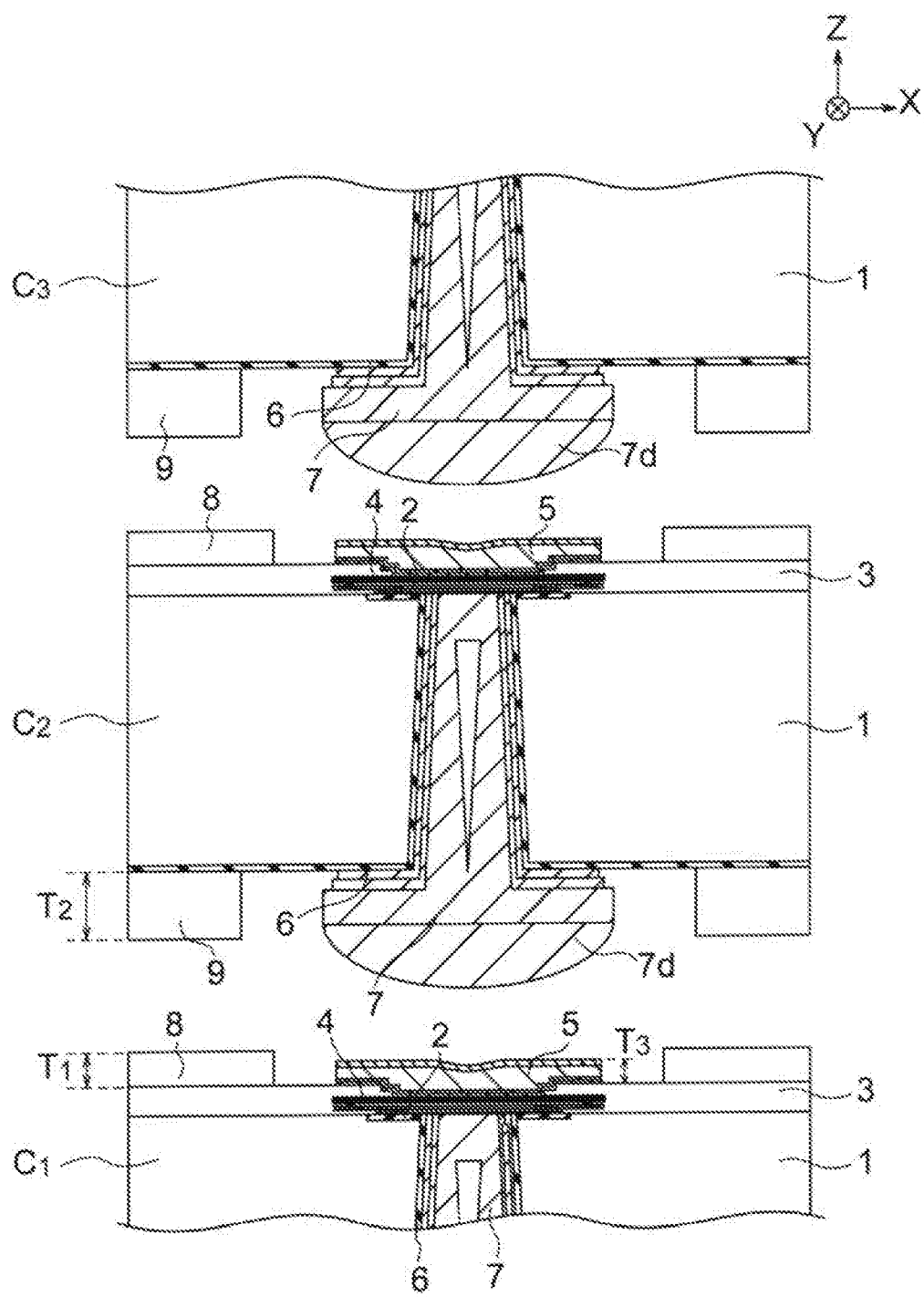
FIG. 2 is a partial sectional view of a plurality of semiconductor devices of FIG. 1 depicting a method for connecting the semiconductor chips according to the first embodiment.
Figure 3:
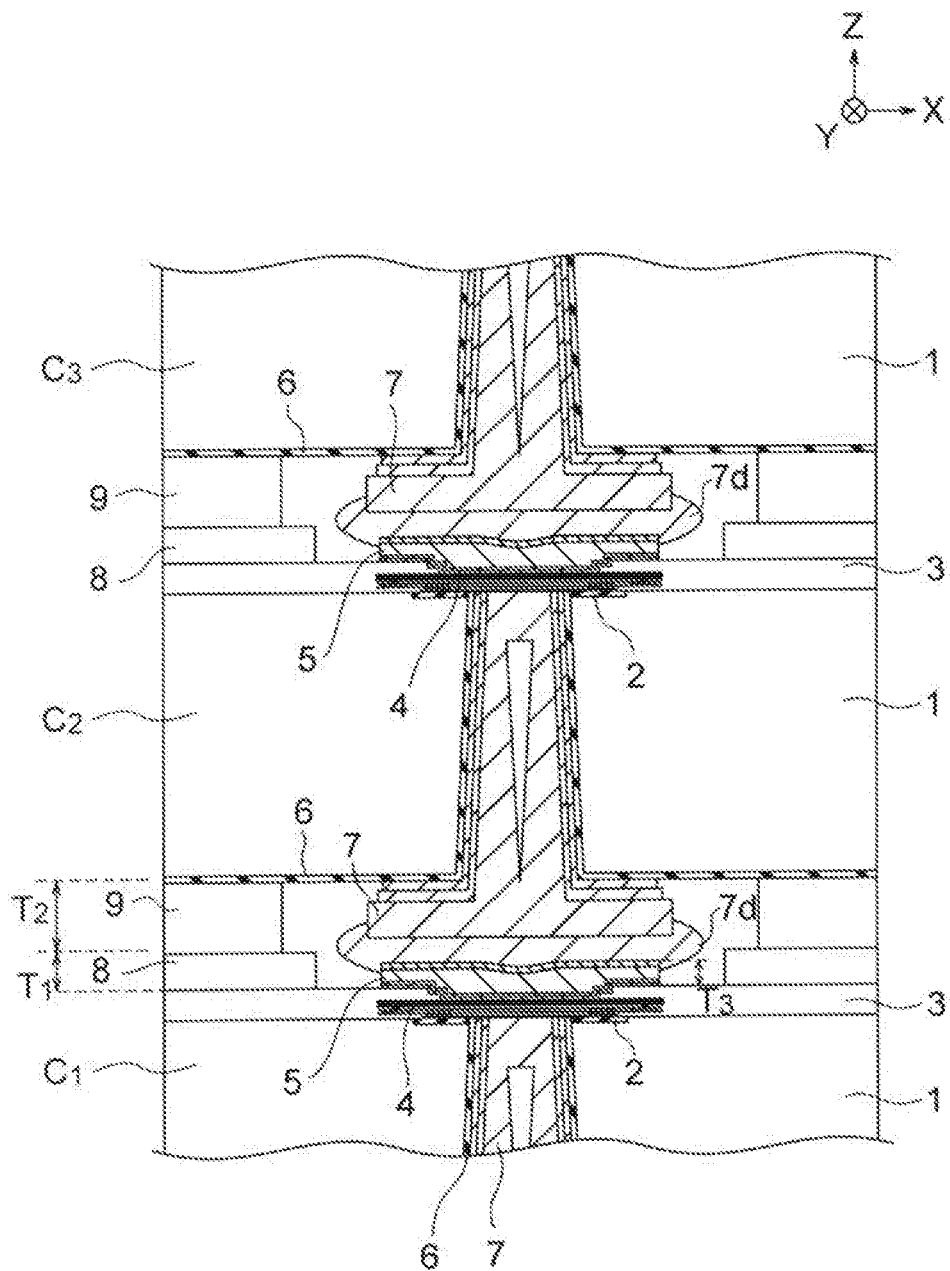
FIG. 3 is a partial sectional view of a plurality of semiconductor devices of FIG. 1 depicting the method for connecting the semiconductor chips according to the first embodiment.

FIGS. 2 and 3 are sectional views depicting a method for connecting the semiconductor chips according to the first embodiment.

FIGS. 2 and 3 depict semiconductor chips $C_1$ to $C_3$ having the structure of FIG. 1. Incidentally, FIG. 2 depicts the semiconductor chips $C_1$ to $C_3$ before connection and FIG. 3 depicts the semiconductor chips $C_1$ to $C_3$ after connection.

When the semiconductor chips $C_1$ and $C_2$ are electrically connected, the semiconductor chip $C_2$ is stacked on the semiconductor chip $C_1$ (FIG. 3). At this time, the semiconductor chip $C_2$ is stacked on the semiconductor chip $C_1$ so that the back surface electrode 7 of the semiconductor chip $C_2$ comes into contact with the front surface electrode 5 of the semiconductor chip $C_1$ and so that the back surface resist layer 9 of the semiconductor chip $C_2$ comes into contact with the front surface resist layer 8 of the semiconductor chip $C_1$.

Then, the back surface electrode 7 of the semiconductor chip $C_2$ is joined to the front surface electrode 5 of the semiconductor chip $C_1$ by the fourth electrode layer 7d (the solder layer). Moreover, the back surface resist layer 9 of the semiconductor chip $C_2$ is bonded to the front surface resist layer 8 of the semiconductor chip $C_1$ by the adhesive function of the back surface resist layer 9. In this way, the semiconductor chips $C_1$ and $C_2$ are electrically connected. In this case, the semiconductor chip $C_1$ is an example of a first chip and the semiconductor chip $C_2$ is an example of a second chip.

Likewise, when the semiconductor chips $C_2$ and $C_3$ are electrically connected, the semiconductor chip $C_3$ is stacked on the semiconductor chip $C_2$ (FIG. 3). In this case, the semiconductor chip $C_2$ is an example of the first chip and the semiconductor chip $C_3$ is an example of the second chip.

The distance between the adjacent semiconductor chips depends on the total thickness $(T_1+T_2)$ of the front surface resist layer 8 and the back surface resist layer 9 of each chip. The total thickness $(T_1+T_2)$ has to be increased with an increase in the thickness $T_3$ of the front surface electrode 5 of each chip. However, according to this embodiment, since the thickness $T_3$ of the front surface electrode 5 of each chip can be reduced, the total thickness $(T_1+T_2)$ can be reduced. As a result, the distance between the adjacent semiconductor chips can be reduced.

In this embodiment, by electrically connecting the semiconductor chips $C_1$ and $C_2$ and electrically connecting the semiconductor chips $C_2$ and $C_3$, a semiconductor device (a semiconductor module) provided with the semiconductor chips $C_1$ to $C_3$ can be manufactured. Incidentally, the number of semiconductor chips forming the semiconductor module may be a number other than three. According to this embodiment, by reducing the distance between the adjacent semiconductor chips, the thickness of a package of the semiconductor module can be reduced or the number of semiconductor chips forming the semiconductor module can be increased.

Incidentally, the front surface electrode 5 of each chip is desirably formed such that the depression B becomes small and shallow. The reason is as follows. If the depression B is large and deep, the likelihood of the formation of a gap between the front surface electrode 5 and the back surface electrode 7 after joining is increased.

FIGS. 4A and 4B and FIGS. 5A and 5B are plan views depicting the structure of the back surface $S_2$ side of the semiconductor device according to the first embodiment.

Figure 4A:
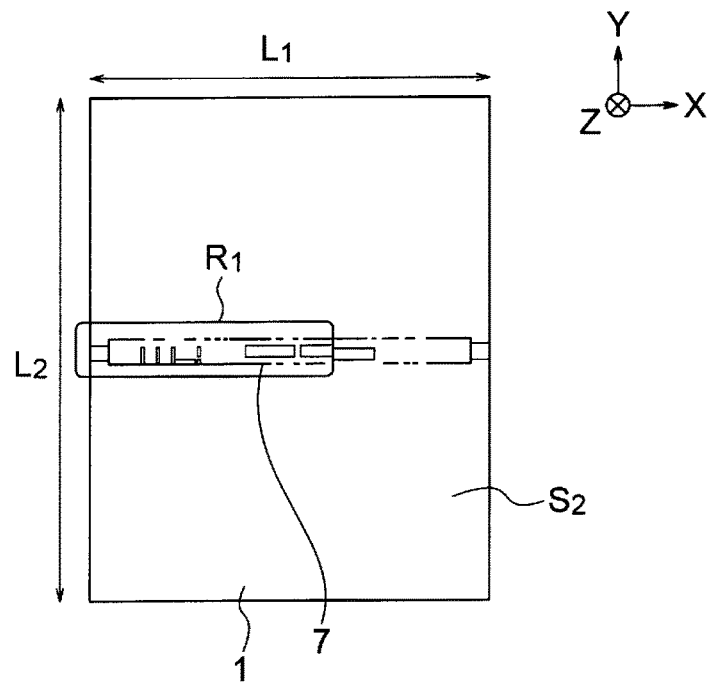
FIGS. 4A and 4B are plan views depicting the structure of the back surface side of the semiconductor device according to the first embodiment.

FIG. 4A depicts the back surface $S_2$ of the substrate 1 of the semiconductor chip of FIG. 1. The character $L_1$ denotes the length of the semiconductor chip in the X direction. The length $L_1$ is 12 mm, for example. The character $L_2$ denotes the length of the semiconductor chip in the Y direction. The length $L_2$ is 15 mm, for example.

Figure 4B:
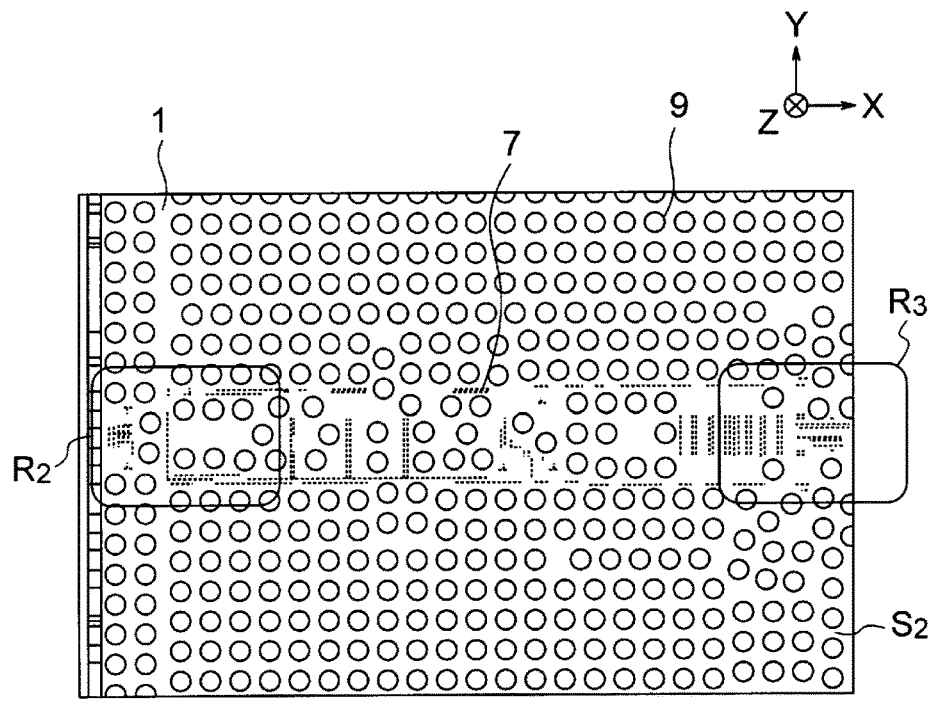

FIG. 4B is an enlarged view of a region $R_1$ of FIG. 4A. FIG. 4B depicts a plurality of back surface electrodes 7 and a plurality of back surface resist layers 9 which are formed on the back surface $S_2$ of the substrate 1.

Figure 5A:
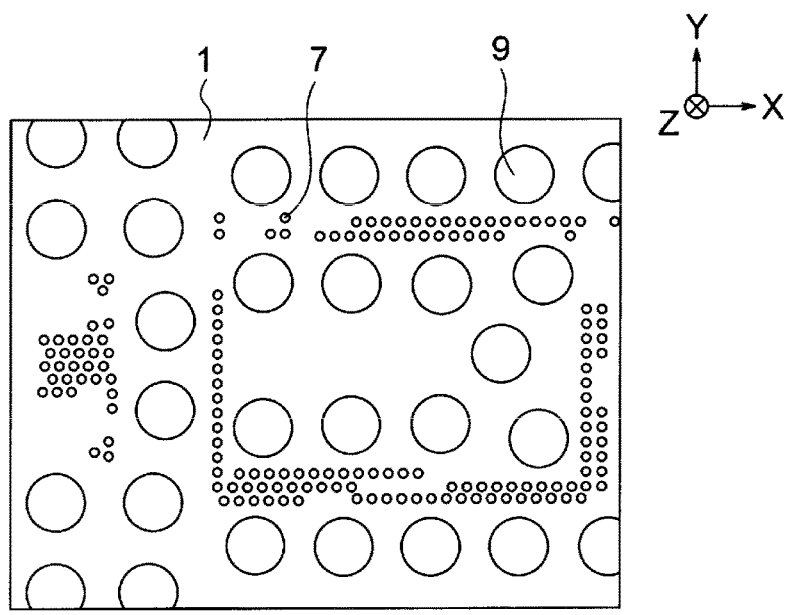
FIGS. 5A and 5B are enlarged partial plan views depicting the structure of the back surface side of the semiconductor device according to the first embodiment.
Figure 5B:
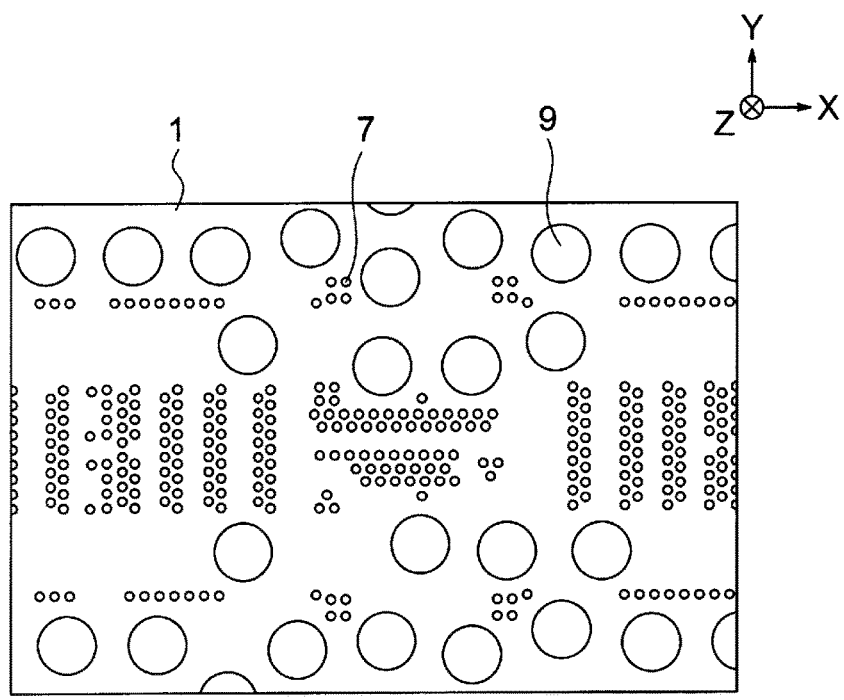

FIGS. 5A and 5B are enlarged views of regions $R_2$ and $R_3$, respectively, of FIG. 4B. As depicted in FIGS. 5A and 5B, each back surface electrode 7 and each back surface resist layer 9 in this embodiment comprise a plurality of circular planar shaped portions. The diameter of each back surface electrode 7 is 20 µm, for example. The diameter of each portion of the back surface resist layer 9 is 40 to 160 µm, for example.

FIGS. 6A to 6C are plan views depicting the structure of the front surface $S_1$ side of the semiconductor device according to the first embodiment.

FIG. 6A depicts an additional example of the structure of the front surface $S_1$ side of the semiconductor chip of FIG. 1. FIG. 6A depicts a plurality of front surface electrodes 5 formed on the front surface $S_1$ of the substrate 1 and the front surface resist layer 8 surrounding these front surface electrodes 5. The outer perimeter α of each front surface electrode 5 and the inner perimeter β of the front surface resist layers 8 respectively have a circular planar shape.

The character $D_1$ denotes the diameter of the outer perimeter α of each front surface electrode 5. The character $D_2$ denotes the diameter of each inner perimeter β of the front surface resist layer 8. In this embodiment, the diameter $D_2$ is set to be greater than the diameter $D_1$; as a result, each front surface electrode 5 is spaced from the front surface resist layer 8. The diameter $D_1$ is 20 µm, for example. The diameter $D_2$ is 25 µm, for example. The diameter $D_1$ is an example of a first diameter and the diameter $D_2$ is an example of a second diameter.

FIG. 6B depicts another example of the structure of the front surface $S_1$ side of the semiconductor chip of FIG. 1. As depicted in FIG. 6B, the planar shape of each inner perimeter β of the front surface resist layer 8 may be a shape other than a circle.

FIG. 6C depicts another example of the structure of the front surface $S_1$ side of the semiconductor chip of FIG. 1. In FIGS. 6A and 6B, one inner perimeter β of the front surface resist layer 8 surrounds only one front surface electrode 5. On the other hand, in FIG. 6C, one inner perimeter β of the front surface resist layer 8 surrounds a plurality of front surface electrodes 5. As described above, there may be any number of front surface electrodes 5 in one inner perimeter β.

A Semiconductor Device According to a Comparative Example of the First Embodiment]

Figure 7:
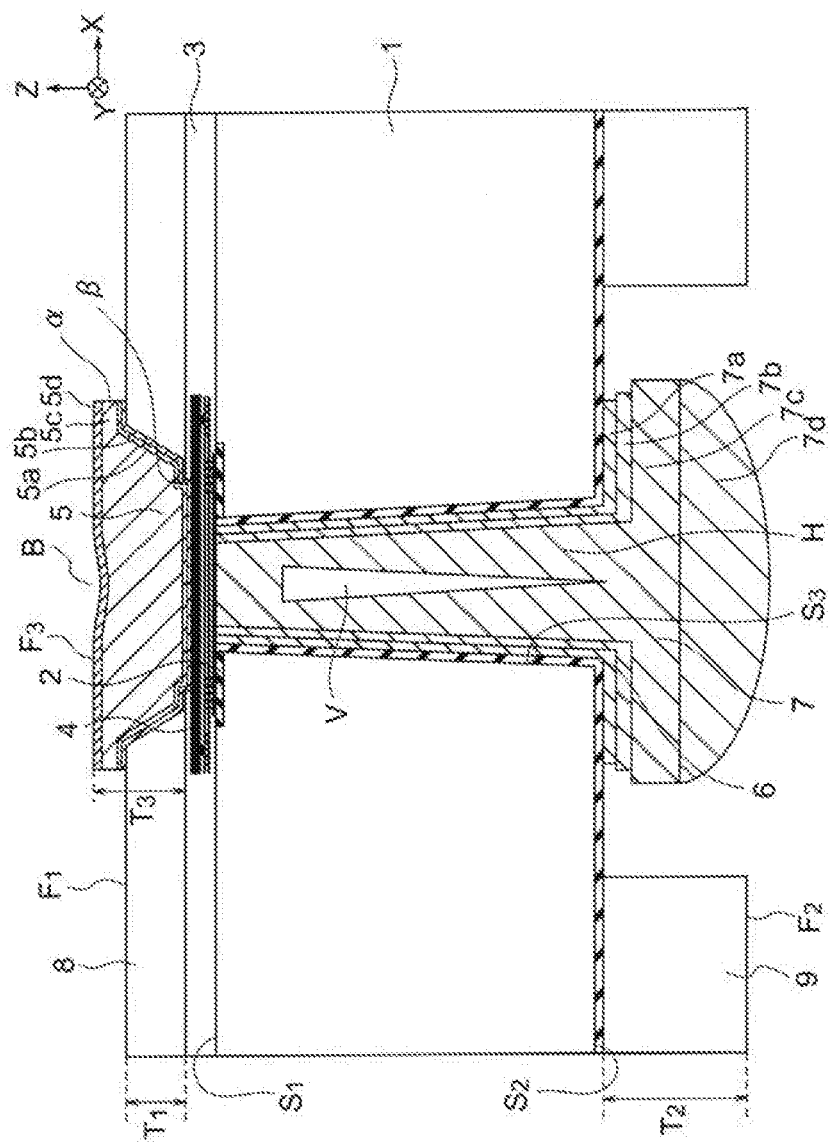
FIG. 7 is a sectional view depicting the structure of a semiconductor device according to a comparative example of the first embodiment.

FIG. 7 is a sectional view depicting the structure of a semiconductor device according to a comparative example of the first embodiment.

The front surface electrode 5 according to this comparative example is formed on the wiring portion 4 via the front surface resist layer 8. Thus, the thickness $T_3$ of the front surface electrode 5 is greater than the thickness $T_1$ of the front surface resist layer 8, and the height of the upper surface $F_3$ of the front surface electrode 5 is higher than the height of the upper surface $F_1$ of the front surface resist layer 8. Therefore, in this comparative example, the thickness $T_2$ of the back surface resist layer 9 is also required to be greater.

Figure 8:
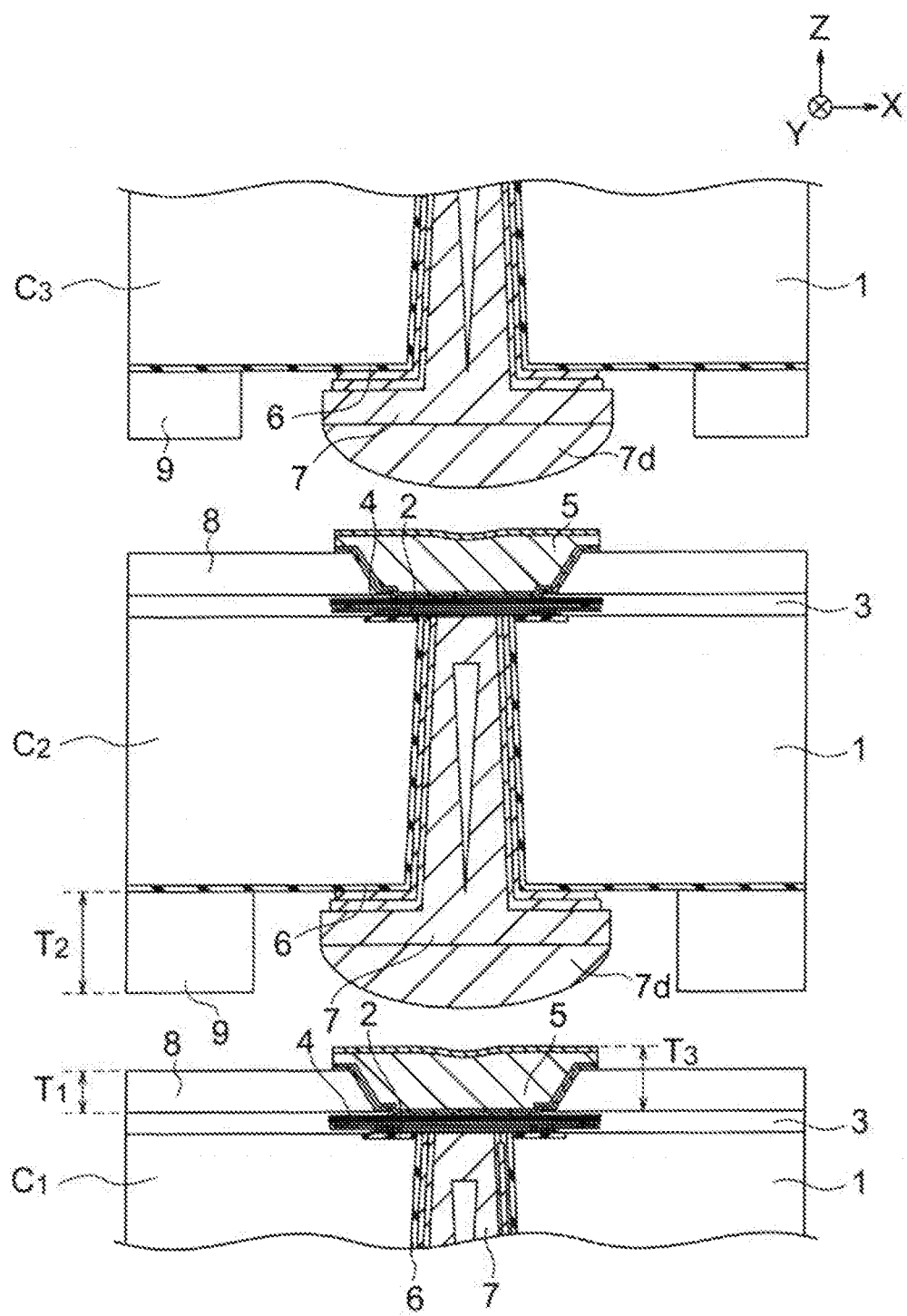
FIG. 8 is an enlarged partial sectional view of a plurality of semiconductor devices of the comparative example depicting a method for connecting the semiconductor chips according to the comparative example of the first embodiment.
Figure 9:
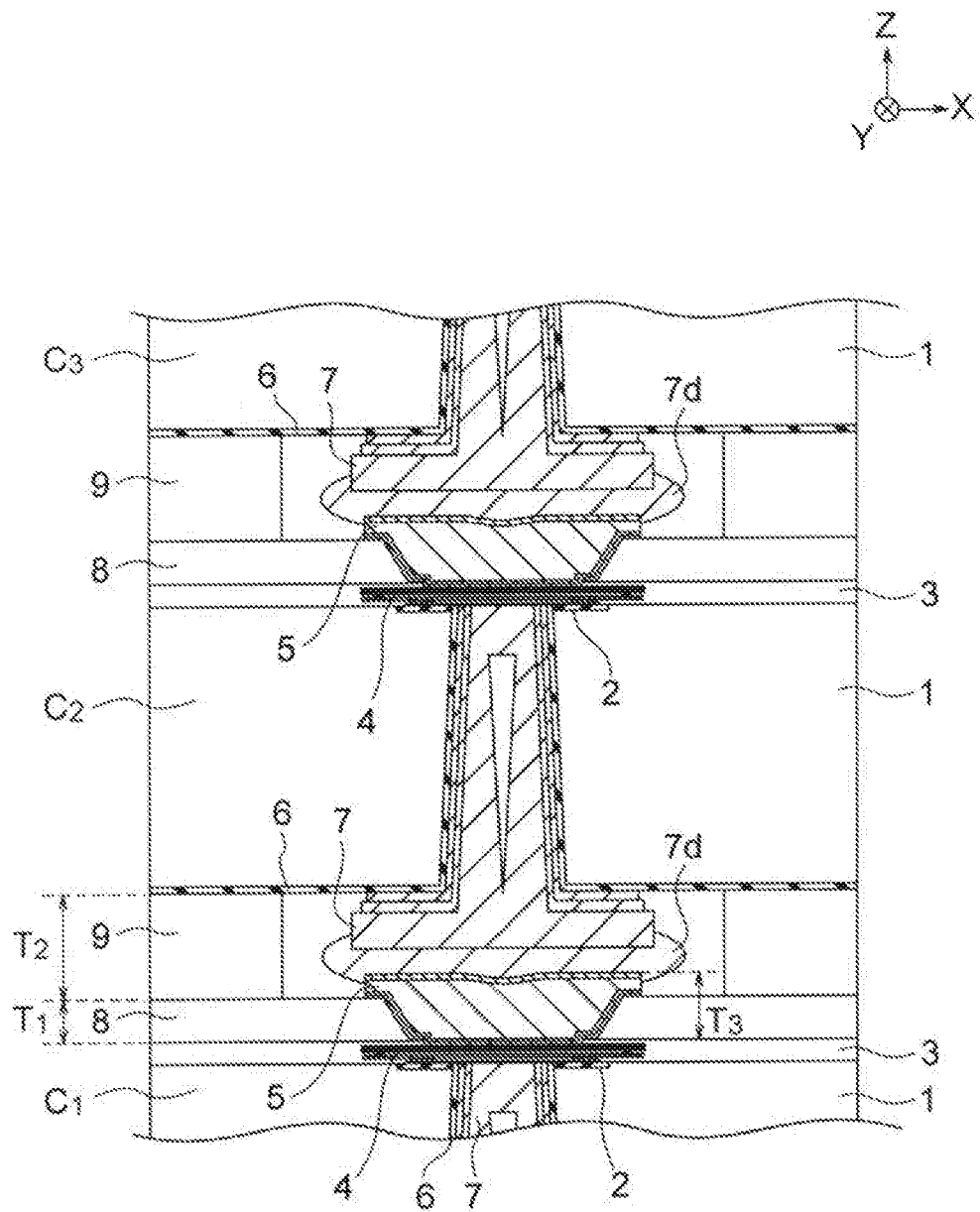
FIG. 9 is an enlarged partial sectional view of a plurality of semiconductor devices of the comparative example depicting the method for connecting the semiconductor chips according to the comparative example of the first embodiment.

FIGS. 8 and 9 are sectional views depicting a method for connecting semiconductor chips according to the comparative example of the first embodiment.

FIGS. 8 and 9 depict semiconductor chips $C_1$ to $C_3$ having the structure of FIG. 7. Incidentally, FIG. 8 depicts the semiconductor chips $C_1$ to $C_3$ before connection and FIG. 9 depicts the semiconductor chips $C_1$ to $C_3$ after connection.

When the semiconductor chips $C_1$ and $C_2$ are electrically connected, the semiconductor chip $C_2$ is stacked on the semiconductor chip $C_1$ (FIG. 9). Moreover, when the semiconductor chips $C_2$ and $C_3$ are electrically connected, the semiconductor chip $C_3$ is stacked on the semiconductor chip $C_2$ (FIG. 9).

The distance between the adjacent semiconductor chips depends on the total thickness $(T_1+T_2)$ of the front surface resist layer 8 and the back surface resist layer 9 of each chip. The total thickness $(T_1+T_2)$ has to be increased with an increase in the thickness $T_3$ of the front surface electrode 5 of each chip. As described above, in this comparative example, since the thickness $T_3$ of the front surface electrode 5 of each chip is great, it is difficult to reduce the total thickness $(T_1+T_2)$. Thus, the distance between the adjacent semiconductor chips is undesirably increased.

On the other hand, according to this embodiment, since the thickness $T_3$ of the front surface electrode 5 of each chip can be reduced, the total thickness ($T_1+T_2$) can be reduced. As a result, the distance between the adjacent semiconductor chips can be reduced.

A Method for Manufacturing the Semiconductor Device According to the First Embodiment]

FIGS. 10A to 14B are sectional views depicting a method for manufacturing the semiconductor device according to the first embodiment.

Figure 10A:
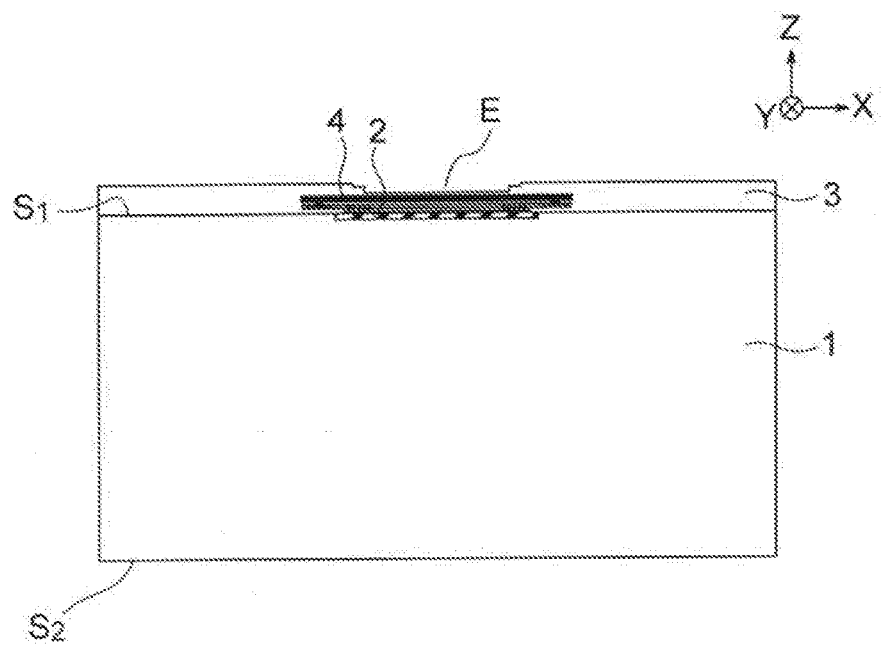
FIGS. 10A and 10B are sectional views of the partially constructed semiconductor device of the first embodiment depicting a method for manufacturing the semiconductor device according to the first embodiment.

First, after the first insulating film 2, the interlayer dielectric 3, and the wiring portion 4 are formed on the front surface $S_1$ of the substrate 1, an opening E reaching the upper surface of the wiring portion 4 is formed in the interlayer dielectric 3 (FIG. 10A).

Figure 10B:
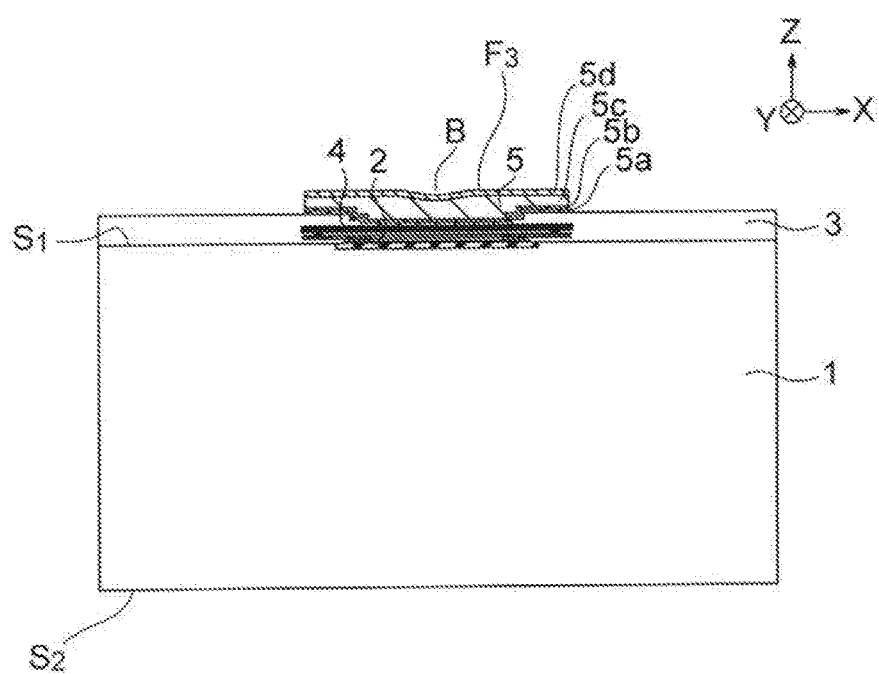

Next, the front surface electrode 5 is formed on the wiring portion 4 (FIG. 10B). The front surface electrode 5 is formed by, for example, forming the first to fourth electrode layers 5a to 5d in order on the interlayer dielectric 3 and the wiring portion 4 and processing the first to fourth electrode layers 5a to 5d by etching. At this time, the depression B may be formed in the upper surface $F_3$ of the front surface electrode 5.

Figure 11A:
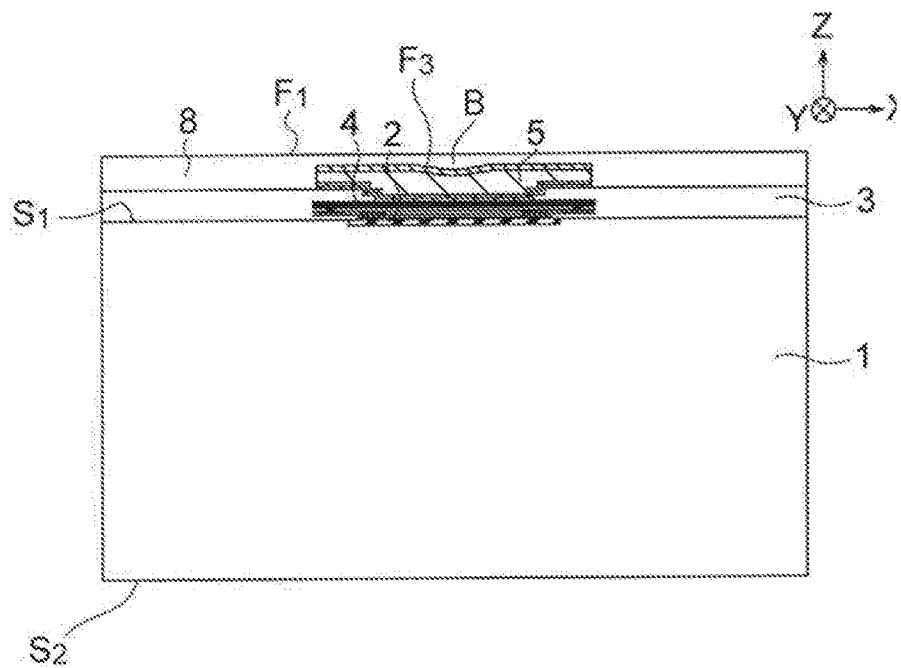
FIGS. 11A and 11B are sectional views of the partially constructed semiconductor device of the first embodiment depicting the method for manufacturing the semiconductor device according to the first embodiment.

Then, the front surface resist layer 8 is formed on the interlayer dielectric 3 and the front surface electrode 5 (FIG. 11A). The front surface resist layer 8 is formed so as to cover the upper surface $F_3$ of the front surface electrode 5. As a result, the height of the upper surface $F_3$ of the front surface electrode 5 is lower than the height of the upper surface $F_1$ of the front surface resist layer 8.

Figure 11B:
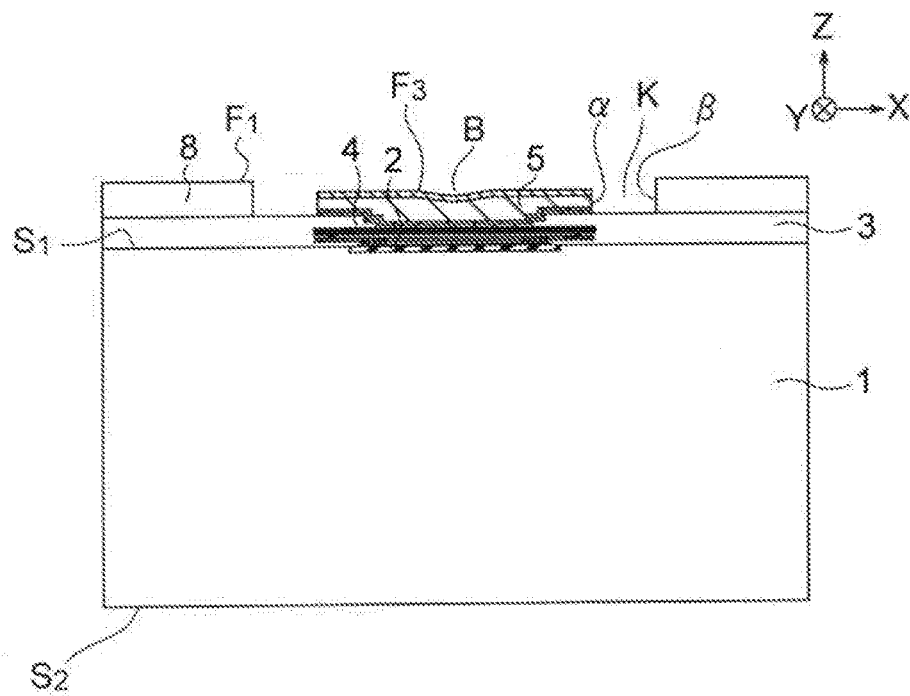

Next, by photolithography and etching, the front surface resist layer 8 in an area near the front surface electrode 5 is removed (FIG. 11B). As a result, the front surface resist layer 8 is worked into a shape in which the front surface resist layer 8 surrounds the front surface electrode 5 and is separated from the front surface electrode 5. The planar shapes of the outer perimeter α of the front surface electrode 5 and the inner perimeter β of the front surface resist layer 8 are circles, for example.

Figure 12A:
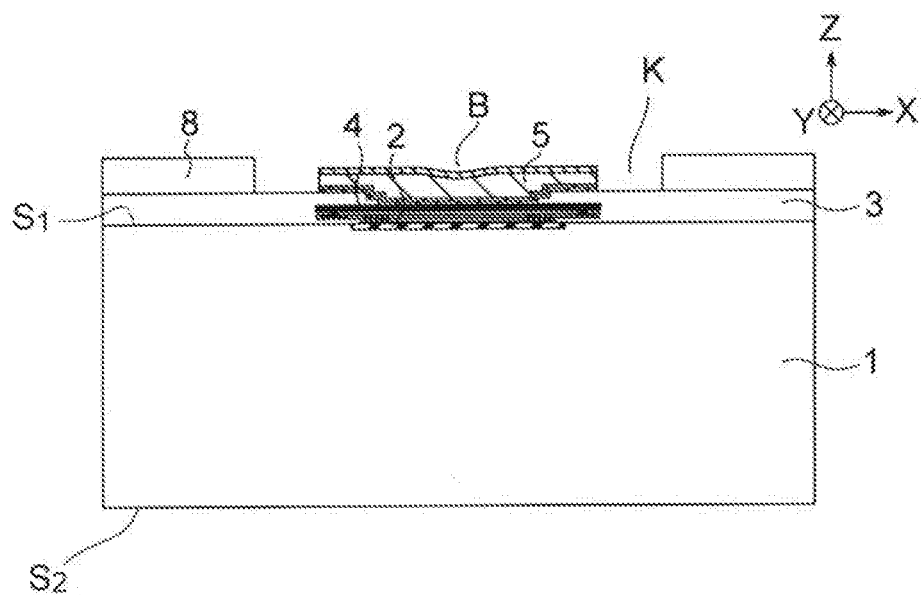
FIGS. 12A and 12B are sectional views of the partially constructed semiconductor device of the first embodiment depicting the method for manufacturing the semiconductor device according to the first embodiment.

Then, the back surface $S_2$ of the substrate 1 is ground to make the substrate 1 thinner (FIG. 12A).

Figure 12B:
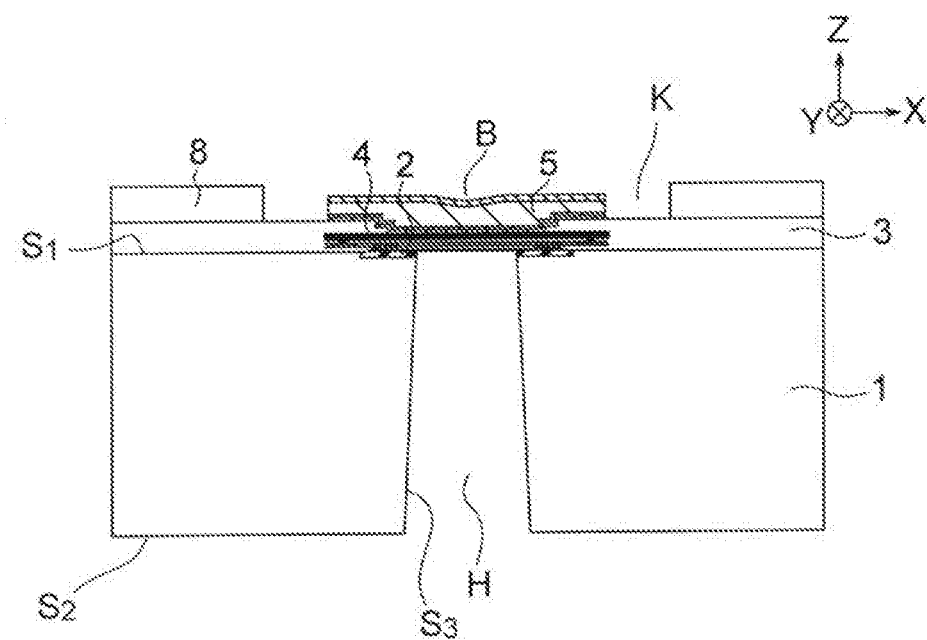

Next, by photolithography and etching, the through hole H is formed in the back surface $S_2$ of the substrate 1 (FIG. 12B). The diameter of the through hole H in the back surface $S_2$ of the substrate 1 is 10 μm, for example. The diameter of the through hole H in the front surface $S_1$ of the substrate 1 is 8 μm, for example.

Figure 13A:
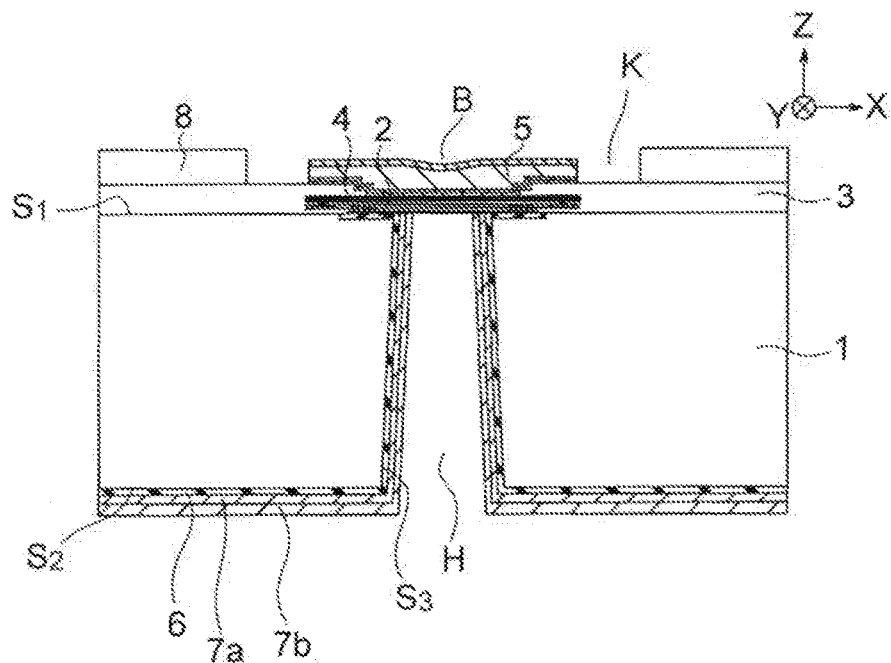
FIGS. 13A and 13B are sectional views of the partially constructed semiconductor device of the first embodiment depicting the method for manufacturing the semiconductor device according to the first embodiment.

Then, the second insulating film 6 is formed on the back surface $S_2$ of the substrate 1, the side surface $S_3$ of the through hole H, and the bottom surface of the through hole H (FIG. 13A). Furthermore, the second insulating film 6 is removed from the bottom surface of the through hole H by etching (FIG. 13A). In addition, the first and second electrode layers 7a and 7b are formed in order on the back surface $S_2$ of the substrate 1, the side surface $S_3$ of the through hole H, and the bottom surface of the through hole H via the second insulating film 6 (FIG. 13A).

Figure 13B:
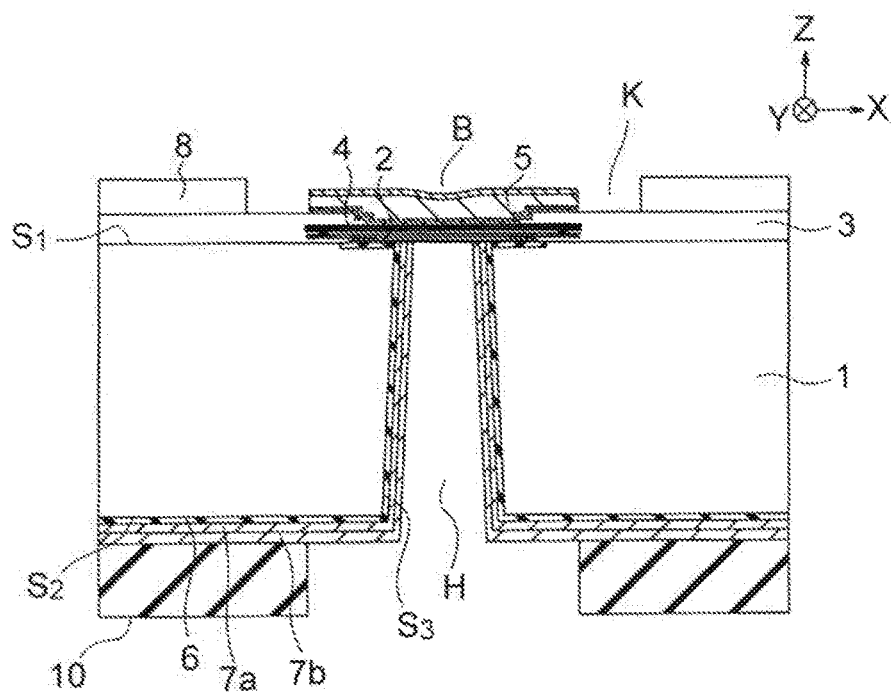

Next, by photolithography and etching, a photoresist layer 10 is formed on the back surface $S_2$ of the substrate 1 (FIG. 13B).

Figure 14A:
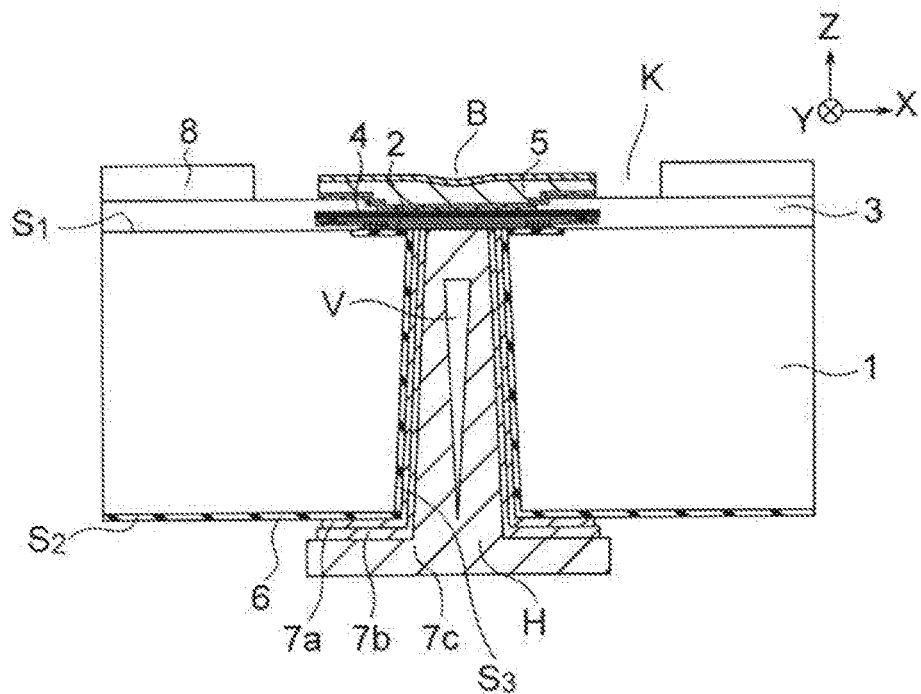
FIGS. 14A and 14B are sectional views showing the final state of the semiconductor device of the first embodiment after manufacturing thereof.

Then, the third electrode layer 7c is formed on the back surface $S_2$ of the substrate 1 and in the through hole H of the substrate 1 by using the photoresist layer 10 as a mask (FIG. 14A). At this time, a void V may be formed in the third electrode layer 7c. Furthermore, after the photoresist layer 10 is removed, the first and second electrode layers 7a and 7b are processed by etching by using the third electrode layer 7c as a mask (FIG. 14A).

Figure 14B:
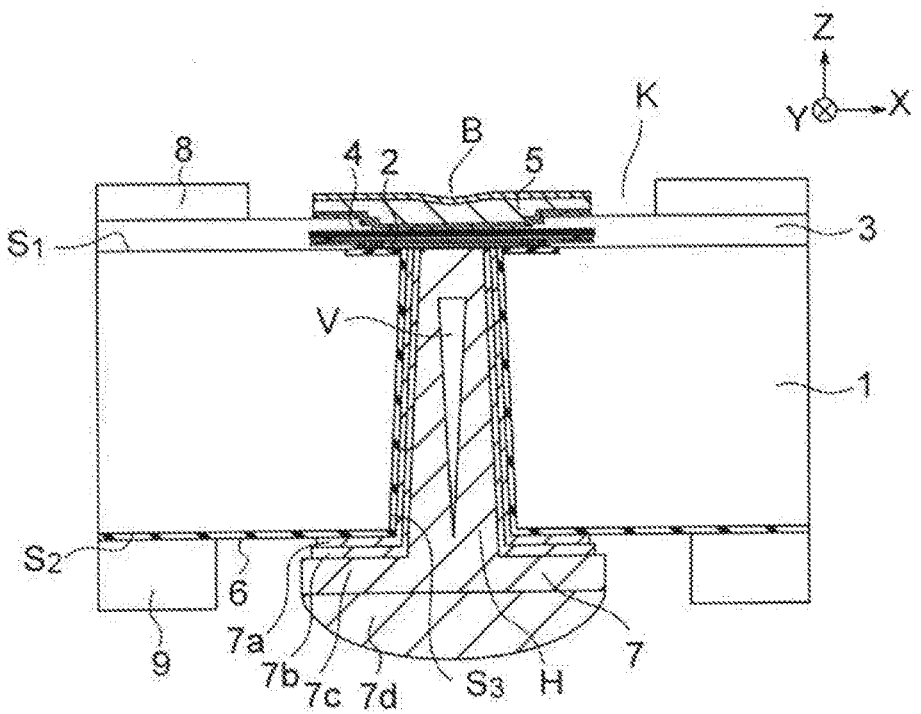

Next, by photolithography and etching, the back surface resist layer 9 is formed on the back surface $S_2$ of the substrate 1 (FIG. 14B). Furthermore, the fourth electrode layer 7d is formed on the lower surface of the third electrode layer 7c (FIG. 14B). As a result, the back surface electrode 7 is formed on the back surface $S_2$ of the substrate and in the through hole H of the substrate 1. The back surface electrode 7 is formed so as to be electrically connected to the wiring portion 4. As a result, the back surface electrode 7 is electrically connected to the front surface electrode 5 by the wiring portion 4, and a TSV electrode including the front surface electrode 5 and the back surface electrode 7 is formed.

In this manner, the semiconductor chip in FIG. 1 is manufactured. Then, the semiconductor module in FIG. 3 is manufactured by using a plurality of semiconductor chips having the structure in FIG. 1.

As described above, the front surface resist layer 8 according to this embodiment is formed on the front surface $S_1$ of the substrate 1, so as to surround the front surface electrode 5 and to be spaced from the front surface electrode 5. Thus, according to this embodiment, when the semiconductor chips having the structure of FIG. 1 are stacked, the distance between the semiconductor chips can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor chip;
a plurality of first electrodes each having a depression in a central portion of an upper surface thereof facing away from the first semiconductor chip, the plurality of first electrodes being located at an upper surface of the first semiconductor chip;
a plurality of second electrodes located at a lower surface of the first semiconductor chip and electrically connected to the plurality of first electrodes;
a first resist layer located at the upper surface of the first semiconductor chip so as to surround the plurality of first electrodes, wherein the plurality of first electrodes are located within an inner perimeter of the first resist layer and spaced from the first resist layer and from one another;
a second resist layer located at the lower surface of the first semiconductor chip; and
a second semiconductor chip having an electrode in contact with the depression of one of the plurality of first electrodes and a resist layer in contact with the first resist layer.

2. The device according to claim 1, wherein
the height of the upper surfaces of the plurality of first electrodes above the upper surface of the first semiconductor chip is lower than the height of an upper surface of the first resist layer above the first semiconductor chip.

3. The device according to claim 1, wherein
the outer perimeter of the plurality of first electrodes comprises a first diameter, and
the inner perimeter of the first resist layer comprises a second diameter greater than the first diameter.

4. The device according to claim 1, wherein
the plurality of second electrodes are provided on the lower surface of the first semiconductor chip and extend within the first semiconductor chip towards the upper surface of the first semiconductor chip.

5. The device according to claim 1, wherein
the second resist layer comprises a plurality of resist portions spaced from the plurality of second electrode.

6. The device according to claim 1, wherein the plurality of second electrodes are electrically connected to the plurality of first electrodes through a wiring layer on the first semiconductor chip.

7. The device according to claim 1, further comprising:
an interlayer dielectric located at the upper surface of the first semiconductor chip, having an opening, wherein
the plurality of first electrodes are provided in the opening of the interlayer dielectric and on the interlayer dielectric.

8. A semiconductor device comprising:
a first chip; and
a second chip located on the first chip,
wherein
each of the first and second chips includes:
  a substrate,
  a plurality of first electrodes each having a depression in a central portion of an upper surface thereof facing away from the substrate, the plurality of electrodes being located at an upper surface of the substrate,
  a plurality of second electrodes located at a lower surface of the substrate and electrically connected to the plurality of first electrodes,
  a first resist layer located at the upper surface of the substrate so as to surround the plurality of first electrodes, wherein the plurality of first electrodes are located within an inner perimeter of the first resist layer and spaced from the first resist layer and from one another, and
  a second resist layer located at the lower surface of the substrate, and
the second chip is located on the first chip so that the plurality of second electrodes of the second chip come into contact with the plurality of first electrodes of the first chip and the second resist layer of the second chip is in contact with the first resist layer of the first chip.

9. The device according to claim 8, wherein
the second chip is located on the first chip so that the second resist layer of the second chip comes into contact with the first resist layer of the first chip.

10. The device according to claim 8, wherein the second resist comprises a plurality of resist portions and the plurality of resist portions are spaced from the second electrode.

11. The device according to claim 8, wherein the first resist layer comprises an opening therein, and a plurality of first electrodes are located within the opening and spaced from one another and from the resist layer adjacent to the opening.

12. The device according to claim 8, wherein the first resist layer extends further from the substrate than the plurality of first electrodes extends from the substrate.

* * * * *